(12) United States Patent
Wang et al.

(10) Patent No.: US 9,606,155 B2
(45) Date of Patent: Mar. 28, 2017

(54) CAPACITANCE MEASUREMENT CIRCUIT AND METHOD

(71) Applicant: Taiwan Semiconductor Manufacturing CO., LTD., Hsinchu (TW)

(72) Inventors: Mill-Jer Wang, Hsinchu (TW); Ching-Nen Peng, Hsinchu (TW); Hung-Chih Lin, Hsinchu (TW); Hao Chen, New Taipei (TW); Chung-Han Huang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 321 days.

(21) Appl. No.: 14/132,722

(22) Filed: Dec. 18, 2013

(65) Prior Publication Data

US 2015/0168459 A1 Jun. 18, 2015

(51) Int. Cl.
*G01R 27/26* (2006.01)
*G01R 31/28* (2006.01)

(52) U.S. Cl.
CPC ..... *G01R 27/2605* (2013.01); *G01R 31/2856* (2013.01)

(58) Field of Classification Search
USPC ......... 324/537, 750.3, 140 R, 548, 601, 606, 324/76.11, 656–686; 73/304 C, 514.32; 702/65; 257/E21.531, 48, 304 C, 514.32; 307/109
See application file for complete search history.

(56) References Cited

U.S. PATENT DOCUMENTS

| | | | | |
|---|---|---|---|---|
| 4,716,361 A * | 12/1987 | Sheffer | ............... | G01R 17/06 324/608 |
| 6,535,824 B1 * | 3/2003 | Mansky | ............... | B01J 19/0046 374/49 |
| 2007/0158783 A1 * | 7/2007 | Chen | ............... | H01L 23/5223 257/534 |
| 2008/0150551 A1 * | 6/2008 | Kim | ............... | G01R 27/2605 324/658 |
| 2008/0296697 A1 * | 12/2008 | Hsu | ............... | H01L 23/49827 257/379 |
| 2010/0090714 A1 * | 4/2010 | Van Geloven | ............... | H01L 23/576 324/705 |
| 2011/0074446 A1 * | 3/2011 | Chou | ............... | G06F 3/0418 324/679 |
| 2011/0122006 A1 * | 5/2011 | Liao | ............... | H03M 1/1047 341/120 |
| 2011/0163994 A1 * | 7/2011 | Tang | ............... | G06F 3/044 345/174 |
| 2012/0256774 A1 * | 10/2012 | Dey | ............... | H03M 1/109 341/120 |

* cited by examiner

*Primary Examiner* — Melissa Koval
*Assistant Examiner* — Nasima Monsur

(57) ABSTRACT

A circuit includes a stacked circuit layer, a plurality of test contact points, and a comparator. The stacked circuit layer includes a plurality of reference capacitors each having a reference capacitance. Each of the test contact points is electrically connecting to an under-test capacitor of an under-test module. The comparator compares the reference capacitance of one of the reference capacitors with an under-test capacitance of the under-test capacitor corresponding to one of the test contact points to measure a range of the under-test capacitance.

20 Claims, 8 Drawing Sheets

CAPACITANCE MEASUREMENT CIRCUIT AND METHOD

BACKGROUND

Three dimensional (3-D) or two point five dimensional (2.5-D) circuits provide broad spaces for metal-insulator-metal design and reduce required circuit design areas. In order to analyze behaviors of the 3-D or 2.5-D circuit, measurements for tiny capacitances are performed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
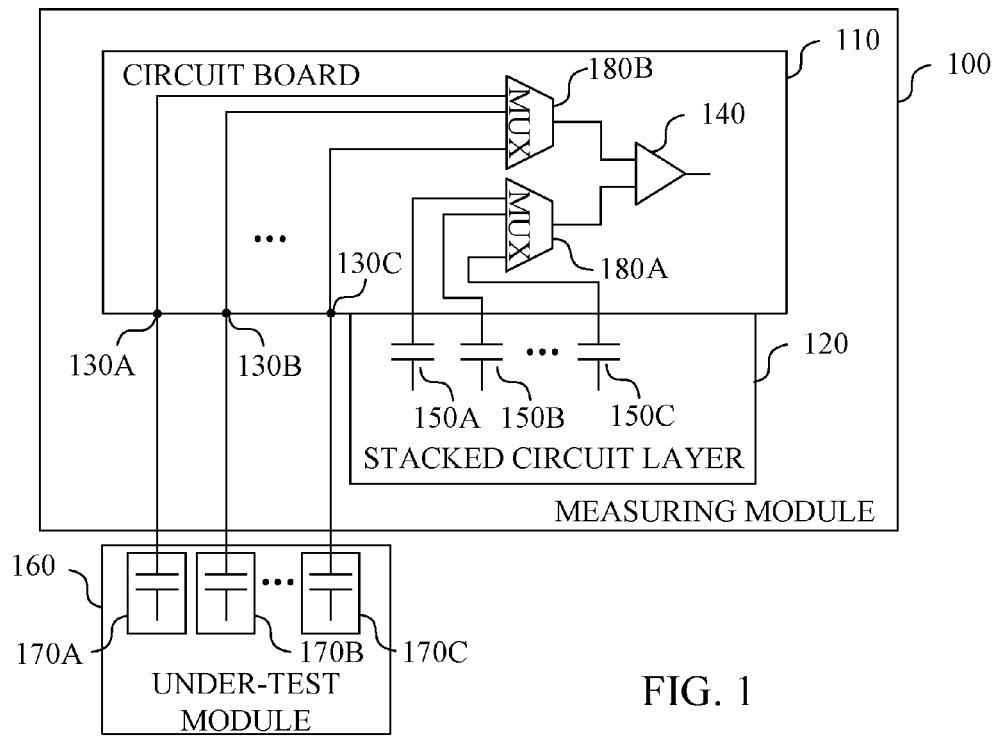
FIG. 1 is an exemplary diagram of a measuring module together with an under-test module in accordance with various embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 2:
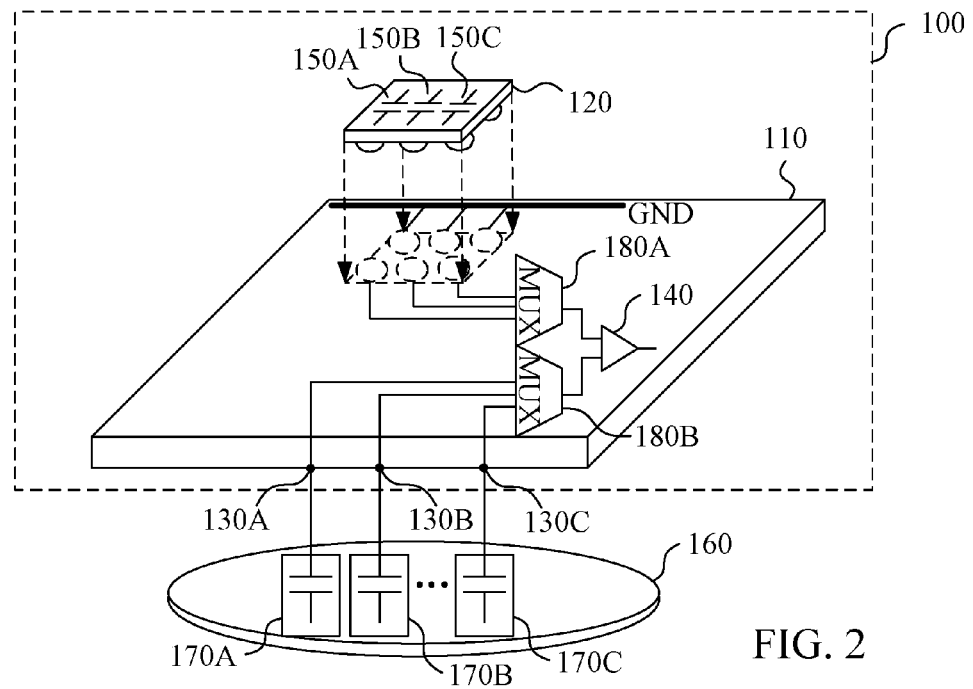
FIG. 2 is a schematic 3-D (three dimensional) diagram of the measuring module together with the under-test module in accordance with various embodiments of the present disclosure.

FIG. 1 is an exemplary diagram of a measuring module 100 together with an under-test module 160, in accordance with various embodiments of the present disclosure. FIG. 2 is a schematic 3-D (three dimensional) diagram of the measuring module 100 together with the under-test module 160, in accordance with various embodiments of the present disclosure.

The measuring module 100 includes a circuit board 110, a stacked circuit layer 120, and test contact points 130A, 130B and 130C.

The stacked circuit layer 120 is disposed on the circuit board 110. In various embodiments, the stacked circuit layer 120 is physically embedded in the circuit board 110, as illustrated in FIG. 2.

In some embodiments, the stacked circuit layer 120 is either a wafer or a metal-insulator-metal layer. In some embodiments, the stacked circuit layer 120 includes a stacked CMOS layer having various circuit components formed therein.

The stacked circuit layer 120 includes reference capacitors 150A, 150B and 150C, and each of the reference capacitors 150A, 150B and 150C has a reference capacitance. In some embodiments, each of the reference capacitors 150A, 150B and 150C is a metal-insulator-metal capacitor.

The under-test module 160 includes under-test capacitors 170A, 170B and 170C. The under-test capacitors 170A, 170B and 170C are configured to be electrically connected to the test contact points 130A, 130B and 130C, respectively. In some embodiments, each of the under-test capacitors 170A, 170B and 170C is a metal-insulator-metal capacitor. In some embodiments, the under-test module 160 is a wafer or a metal-insulator-metal layer.

The measuring module 100 further includes a comparator 140. The comparator 140 is configured to compare the reference capacitance of at least one of the reference capacitors 150A, 150B and 150C, with an under-test capacitance of one of the under-test capacitors 170A, 170B and 170C, to measure a range of the corresponding under-test capacitance.

As illustrated in FIG. 1, in some embodiments, the measuring module 100 further includes a multiplexer 180A and a multiplexer 180B. Outputs of the multiplexers 180A and 180B are electrically connected to inputs of the comparator 140, respectively. As illustrated in FIG. 2, in some embodiments, an end of each of the reference capacitors 150A, 150B and 150C is electrically connected to a ground terminal GND, and the other end of each of the reference capacitors 150A, 150B and 150C is electrically connected to the multiplexer 180A. Further, each of the test contact points 130A, 130B and 130C is electrically connected to the multiplexer 180B. In some embodiments, the multiplexer 180A and the multiplexer 180B are integrated into a single multiplexer.

For illustration in FIG. 1 and FIG. 2, the multiplexer 180A, the multiplexer 180B and the comparator 140 are formed on the circuit board 110. In some embodiments, the circuit board 110 includes other circuit modules (not shown) in addition to the multiplexer 180A, the multiplexer 180B and the comparator 140.

The multiplexer 180A is configured to select one of the reference capacitors 150A, 150B and 150C to be conducted. Moreover, the multiplexer 180B is configured to select one of the test contact points 130A, 130B and 130C to be conducted, and thus a corresponding one of the under-test capacitors 170A, 170B and 170C is selected to be conducted. The comparator 140 compares the reference capacitance of the selected reference capacitor with an under-test capacitance of the under-test capacitor corresponding to the selected test contact point. According to the comparison made by the comparator 140, a range of the under-test capacitance is measured and obtained.

For example, the comparator 140 compares the reference capacitance of 2 femtofarad (fF) with the under-test capacitance, and then determines that the under-test capacitance is larger than 2 femtofarad. Subsequently, the comparator 140 compares the reference capacitance of 4 femtofarad with the under-test capacitance, and determines that the under-test capacitance is smaller than 4 femtofarad. As a result, the range of the under-test capacitance is measured to be 2-4 femtofarad after the two stages of comparison.

In some embodiments, the reference capacitances of at least a part of the reference capacitors 150A, 150B and 150C are smaller than about 1 picofarad (pF). For a numerical example, the reference capacitances of the reference capacitors 150A, 150B and 150C are 2 femtofarad (fF), 4 femtofarad (fF) and 6 femtofarad (fF), respectively. Since the reference capacitances are configured to be smaller than about 1 picofarad (pF), the measuring module 100 is able to measure the under-test capacitances that are smaller than about 1 picofarad (pF).

In some embodiments, each of the under-test module 160 and the stacked circuit layer 120 is implemented by an integrated circuit package. Under such a condition, a plurality of sockets (not shown) including the test contact points 130A, 130B and 130C are formed on the measuring module 100, to be adapted to the under-test capacitors of the under-test module 160.

In approaches of testing the under-test module that has the under-test capacitors in the form of metal-insulator-metal, the capacitances are tiny and are hard to be measured. Compared to the approaches, the comparator 140 of the measuring module 100 is used to compare the reference capacitances in the stacked circuit layer 120 with the under-test capacitances. As a result, the range of the under-test capacitances are measured accurately.

Figure 3:
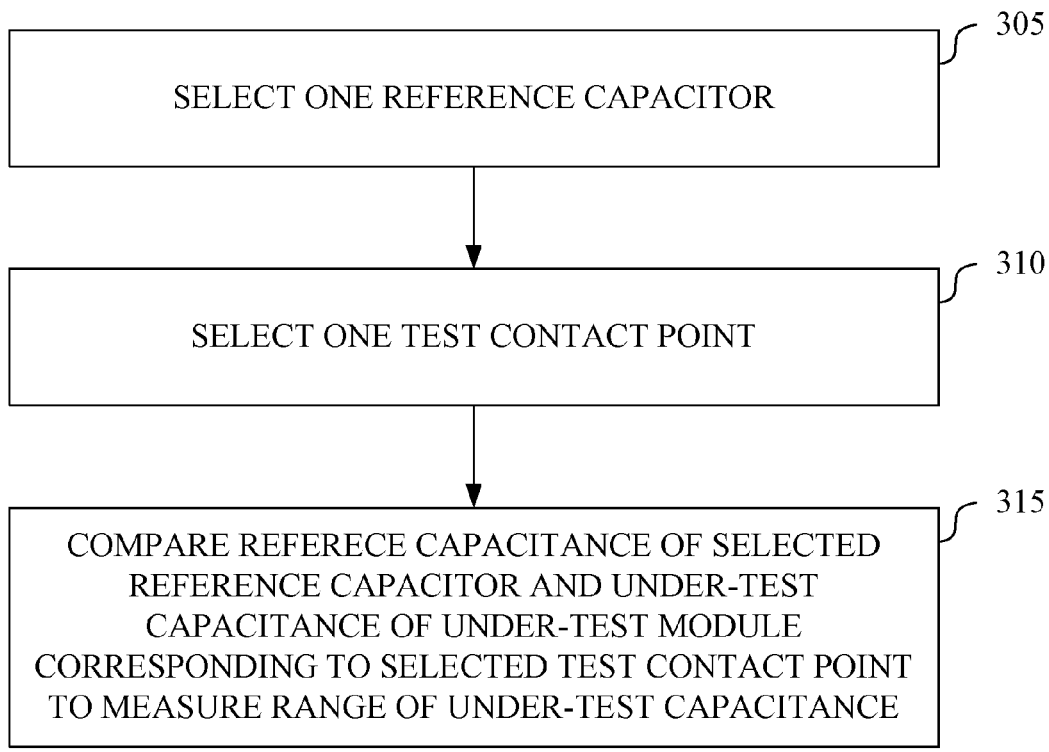
FIG. 3 is a flow chart of a capacitance-measuring method in accordance with various embodiments of the present disclosure.

FIG. 3 is a flow chart of a capacitance-measuring method 300 in accordance with various embodiments of the present disclosure. In some embodiments, the capacitance-measuring method 300 is applied in the measuring module 100 illustrated in FIG. 1. For illustration, operations of the measuring module 100 illustrated in FIG. 1 are described by the capacitance-measuring method 300.

In operation 305, one of the reference capacitors 150A, 150B and 150C is selected. For illustration, the reference capacitor 150A is selected.

In operation 310, one of the test contact points 130A, 130B and 130C is selected. For illustration, the test contact point 130A is selected.

In operation 315, the reference capacitance of the selected reference capacitor and the under-test capacitance corresponding to the selected test contact point are compared by the comparator 140. A range of the under-test capacitance is measured accordingly. For illustration, the reference capacitance of the reference capacitor 150A and the under-test capacitance corresponding to the test contact point 130A are compared. If the comparator 140 determines that the under-test capacitance is smaller than the reference capacitance, the range of the under-test capacitance is measured to be smaller than the reference capacitance of the reference capacitor 150A.

Figure 4:
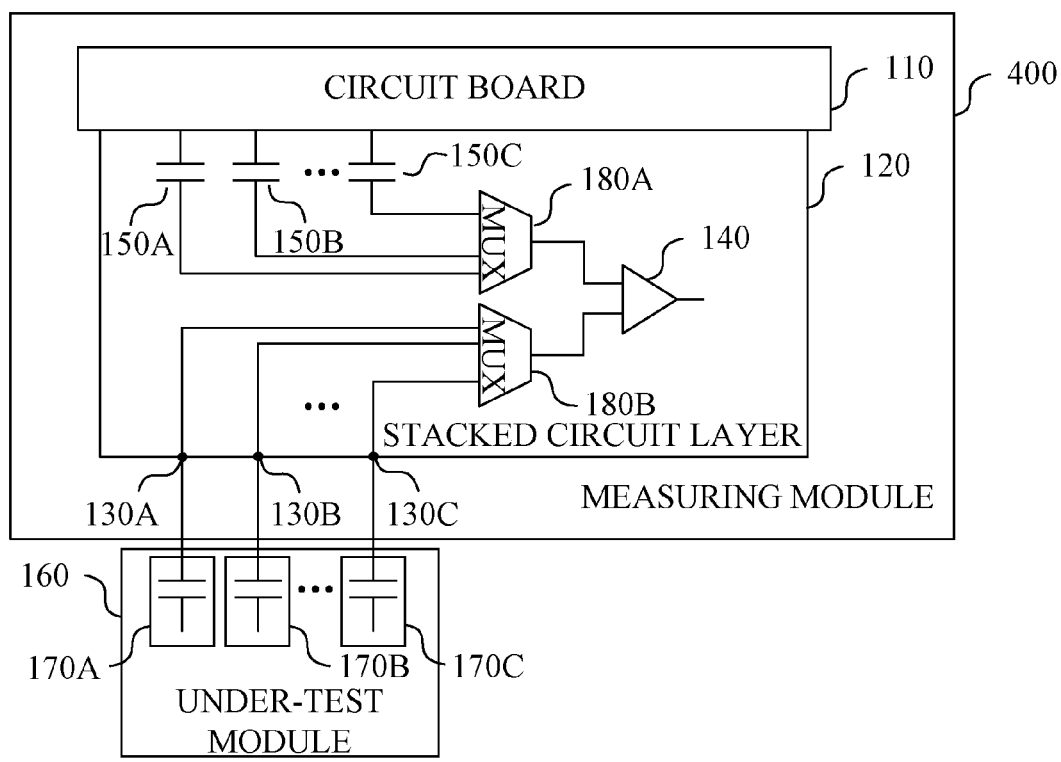
FIG. 4 is an exemplary diagram of a measuring module together with the under-test module in accordance with various embodiments of the present disclosure.

FIG. 4 is an exemplary diagram of a measuring module 400 together with the under-test module 160 in accordance with various embodiments of the present disclosure.

The measuring module 400 substantially includes the same components as those of the measuring module 100 illustrated in FIG. 1. Compared with the measuring module 100 in FIG. 1, the comparator 140, the multiplexer 180A and the multiplexer 180B are formed in the stacked circuit layer 120 instead of the circuit board 110.

Similar to the operation of the measuring module 100 illustrated in FIG. 1, the comparator 140 compares each of the under-test capacitances of the under-test capacitors 170A, 170B and 170C with at least one of the reference capacitances 150A, 150B and 150C. As a result, ranges of the under-test capacitances of the under-test capacitors 170A, 170B and 170C are measured, respectively, according to the comparisons.

Figure 5A:
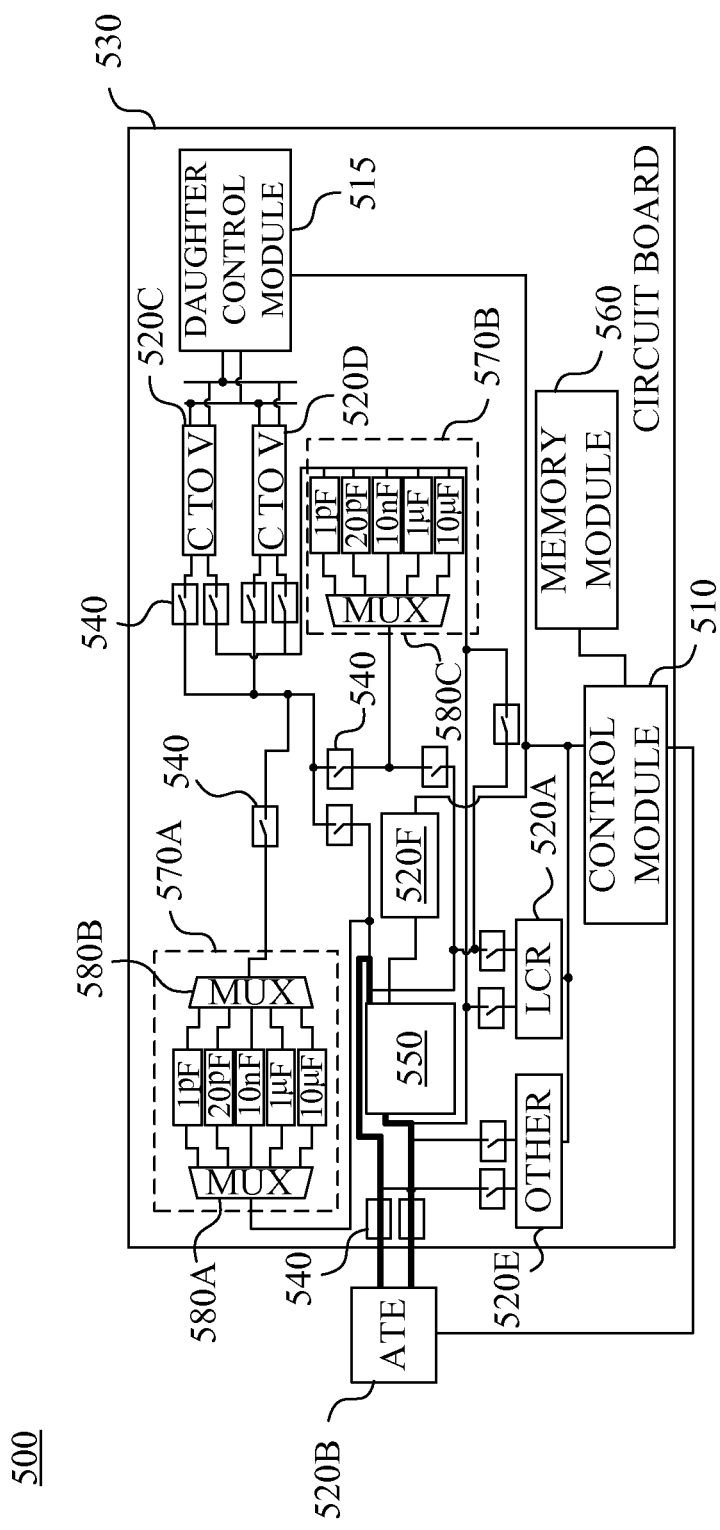
FIG. 5A is an exemplary diagram of a capacitance-measuring system in accordance with various embodiments of the present disclosure.

FIG. 5A is an exemplary diagram of a capacitance-measuring system 500 in accordance with various embodiments of the present disclosure.

The system 500 includes a control module 510 and a plurality of test equipments that are described below. In some embodiments, the control module 510 and at least one of the test equipments are disposed or formed on a circuit board 530.

In some embodiments, the test equipments include an inductance-capacitance-resistance (LCR) measuring instrument 520A (labeled as "LCR" in FIG. 5A), an automatic test equipment (ATE) 520B, two capacitance-to-voltage (labeled as "C to V" in FIG. 5A) converters 520C and 520D, a customized measuring module 520E (labeled as "OTHER" in FIG. 5A), a measuring module 520F or a combination thereof.

The test equipments are under the control of the control module 510. In some embodiments, the capacitance-to-voltage converters 520C and 520D are controlled by the control module 510 through an additional daughter control module 515. Furthermore, the capacitance-to-voltage converters 520C and 520D are controlled by using various kinds of communication interfaces which, in some embodiments, include $I^2C$ bus.

Different test equipments have different capacitance-measuring ranges. In some embodiments, the LCR measuring instrument 520A is configured to measure the capacitances of the capacitors within a range from about 1 picofarad (pF) to about 1000 microfarad. The automatic test equipment 520B is configured to measure the capacitances of the capacitors within a range from about 10 picofarad to over 1000 microfarad. The capacitance-to-voltage converters 520C and 520D are configured to measure capacitances of the capacitors within a range from about 1 picofarad (pF) to about 10 picofarad (pF). In various embodiments, ranges of each of the test equipments are different according to the practical design. Various capacitance-measuring ranges of each of the test equipments are within the contemplated scope of the present disclosure.

The measuring module 520F is substantially the same as the measuring module 100 illustrated in FIG. 1 or the measuring module 400 illustrated in FIG. 4. In some embodiments, the measuring module 520F is integrated into the circuit board 530 where the control module 510 is formed, and thus no additional circuit board for the measuring module 520F is required. In some other embodiments, the measuring module 520F is able to measure the capacitances of the capacitors in a range from below 1 picofarad (pF) to over 1000 microfarad (μF), depending on the reference capacitances of the reference capacitors formed therein.

In some embodiments, the capacitance-measuring system 500 further includes a plurality of switches 540 formed on the circuit board 530. In FIG. 5A, only a part of the switches 540 are exemplarily labeled. The control module 510 controls the switches 540 to enable a measuring path including an under-test module 550 and a selected one of the test equipments.

In some embodiments, the measuring path is a closed loop such that the selected test equipment is connected to two ends of the under-test module 550 to perform measurement. The test equipment in the measuring path is selected from one of the test equipments mentioned above (i.e., 520A-520F) to measure the under-test capacitance of the under-test capacitor (not labeled) in the under-test module 550. Illustrative operations of the control module 510 together with the under-test module 550 and the corresponding test equipment are described below.

In operation, for illustration in FIG. 5A, the control module 510 controls the switches 540 to enable the measuring path illustrated as a thick solid line that connects the under-test module 550 to the automatic test equipment 520B. In such a condition, the automatic test equipment 520B measures the under-test capacitance of the under-test capacitor of the under-test module 550.

In some embodiments, the control module 510 controls the switches 540 to enable various measuring paths based on a capacitance-measuring table (not shown). The capacitance-measuring table stores the capacitance-measuring ranges of the test equipments.

In some embodiments, the capacitance-measuring system 500 further includes a memory module 560. After the test equipment measures the under-test capacitance of the under-test module 550, the control module 510 retrieves the measured value from the selected test equipment. Then, the control module 510 controls the memory module 560 to store the measured under-test capacitance.

Figure 5B:
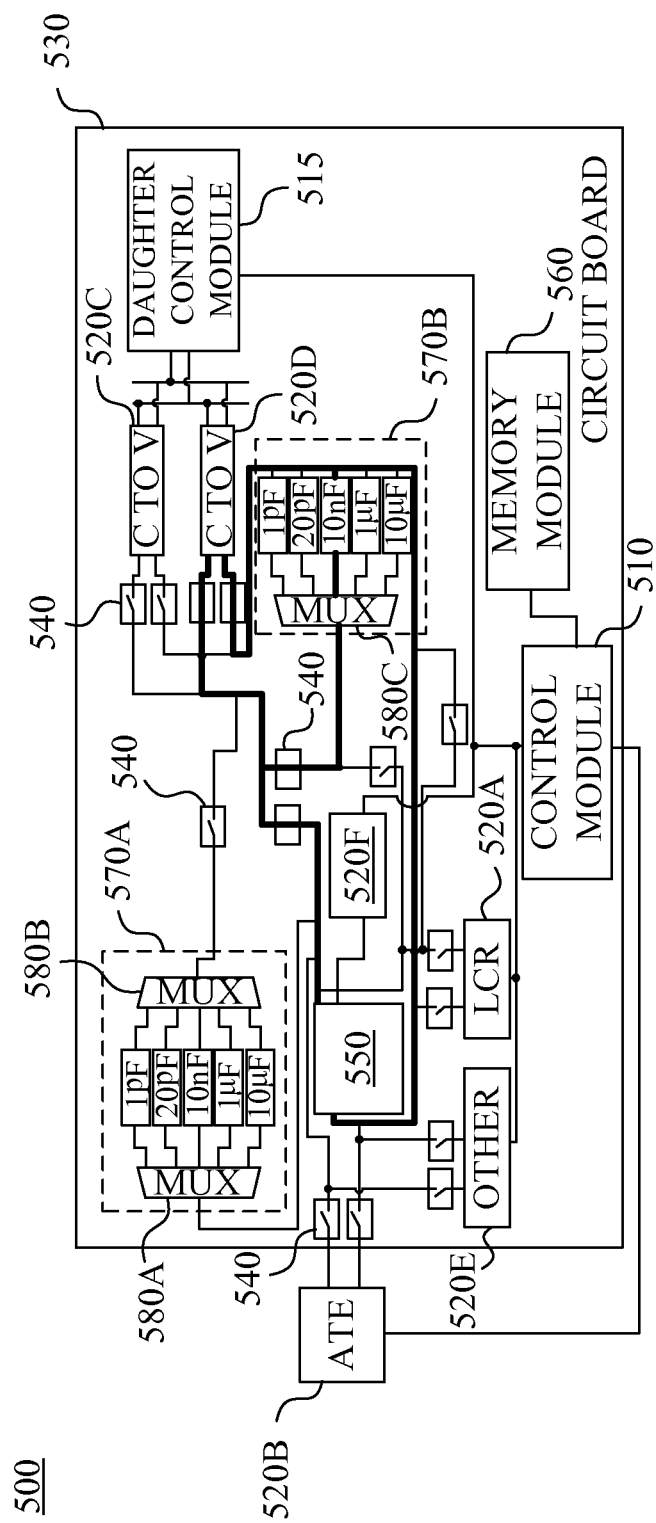
FIG. 5B is an exemplary diagram of the capacitance-measuring system in an alternative operation state in accordance with various embodiments of the present disclosure.

FIG. 5B is an exemplary diagram of the capacitance-measuring system 500 in an alternative operation state in accordance with various embodiments of the present disclosure.

In some embodiments, the capacitance-measuring system 500 further includes adjustable capacitor modules 570A and 570B. For illustration in FIG. 5B, the adjustable capacitor modules 570A includes a multiple of reference capacitors having different reference capacitances and two multiplexers 580A and 580B. One of the reference capacitors is selected by the multiplexers 580A and 580B to be conducted to adjust the capacitance of the adjustable capacitor modules 570A.

Similarly, the adjustable capacitor modules 570B includes a multiple of capacitors having different capacitances, and a multiplexer 580C. One of the capacitor is selected to be conducted by the multiplexer 580C to adjust the capacitance of the adjustable capacitor modules 570B.

In some embodiments, the adjustable capacitor modules 570A and 570B are implemented by variable capacitors.

In some embodiments, the control module 500 controls the switches 540 to enable the measuring path including the under-test module 550, the adjustable capacitor module 570B, and a test equipment selected from the test equipments mentioned above (i.e., 520A-520F). The under-test module 550 and the adjustable capacitor module 570B are either connected in parallel or series according to operations of the switches 540.

For illustration in FIG. 5B, the control module 510 controls the switches 540 to enable the measuring path illustrated as a thick solid line, that connects the under-test module 550 in parallel with the adjustable capacitor module 570B to the capacitance-to-voltage converters 520D.

Under such a condition, the capacitance-to-voltage converters 520D obtains a total measured capacitance in relation to the under-test module 550 and the adjustable capacitor module 570B. The control module 510 further calculates the actual measured capacitance by considering the connection of the adjustable capacitor module 570B with the under-test module 550. Illustrative details are described below.

The total capacitance of capacitors in parallel is equal to the sum of their individual capacitances. Therefore, when the total measured capacitance is $Cm_1$ and the capacitance of the adjustable capacitor module 570B is $Ca_1$, the actual measured under-test capacitance Cu is obtained by the following equation:

$$Cu=Cm_1-Ca_1$$

On the other hand, the total capacitance of capacitors in series is equal to a reciprocal of the sum of the reciprocals of their individual capacitances. Therefore, when the total measured capacitance is $Cm_2$ and the capacitance of the adjustable capacitor module 570A is $Ca_2$, the actual measured under-test capacitance Cu is obtained by the following equation:

$$Cu=(Cm_2 \times Ca_2)/(Ca_2-Cm_2)$$

Effectively, based on various configurations of the adjustable capacitor module 570A or the adjustable capacitor module 570B, the test equipments extend their capacitance-measuring ranges.

Figure 5C:
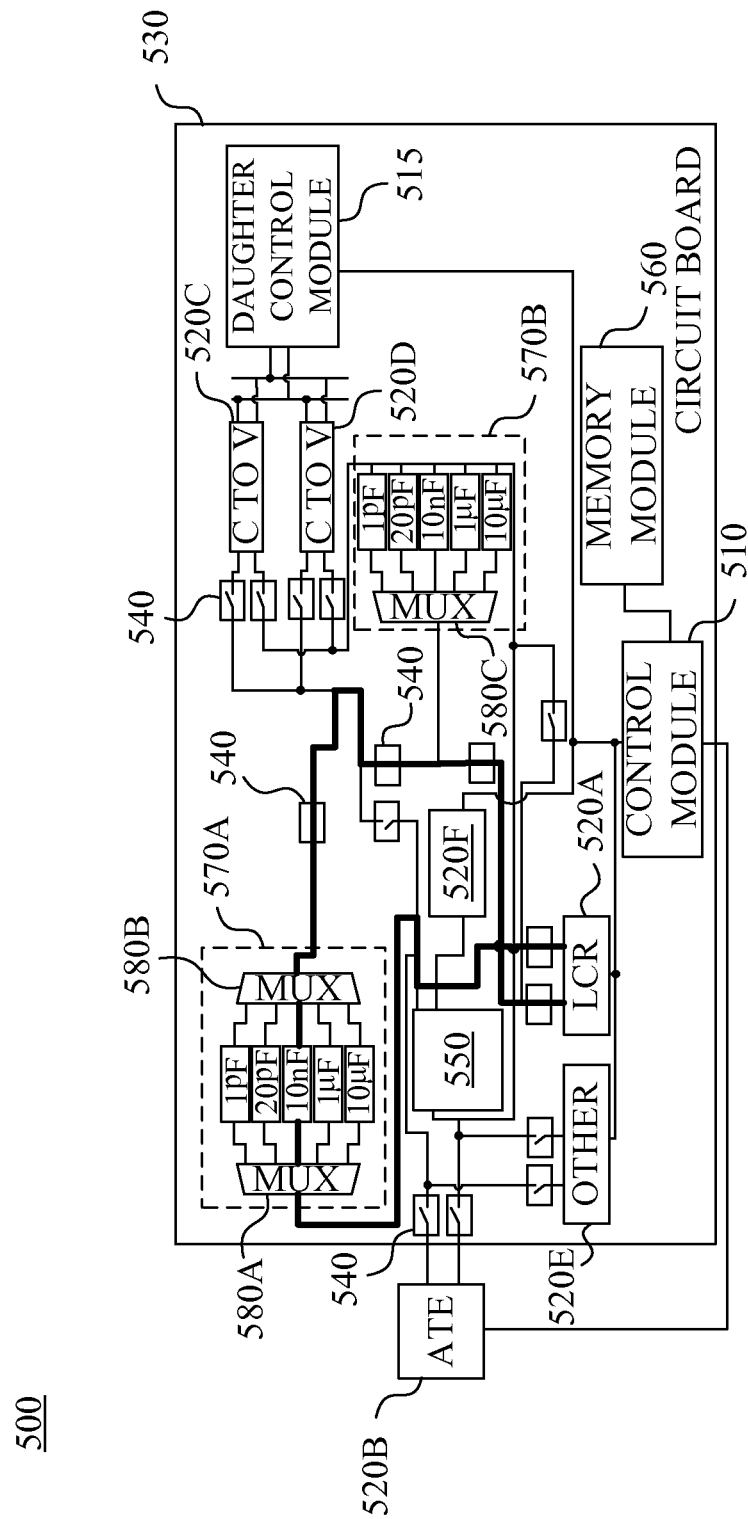
FIG. 5C is an exemplary diagram of the capacitance-measuring system in a calibration state in accordance with various embodiments of the present disclosure.

FIG. 5C is an exemplary diagram of the capacitance-measuring system 500 in a calibration state in accordance with various embodiments of the present disclosure.

Effectively, the control module 500 controls the switches 540 to enable a calibration path including one of the adjustable capacitor modules 570A and 570B, and one of the test equipments mentioned above (i.e., 520A-520F). The selected test equipment further measures the capacitance of the adjustable capacitor module 570A or the adjustable capacitor module 570B to obtain calibration data.

For illustration in FIG. 5C, the control module 510 controls the switches 540 to enable the calibration path illustrated as a thick solid line that connects the adjustable capacitor module 570A and the LCR measuring instrument 520A. The LCR measuring instrument 520A measures the capacitances of the adjustable capacitor module 570A to obtain the calibration data.

In some embodiments, the calibration path is enabled to connect the adjustable capacitor module 570B and other kinds of test equipments to perform calibration.

Since the adjustable capacitor module 570A or 570B degrades over time, deviations of the capacitances of the adjustable capacitor module 570A or 570B are measured during the calibration process. The deviations are further taken into consideration during the measurement of the under-test capacitance.

In some embodiments, after the test equipment measures the capacitance of the adjustable capacitor module 570A or 570B, the control module 510 retrieves the measured value from the test equipment and further controls the memory module 560 to store the calibration data. After obtaining the total measured under-test capacitance of the under-test module 550, the control module 510 retrieves the calibration data, and then further calculates an actual measured under-test capacitance based on the total measured under-test capacitance and the calibration data.

In some embodiments, at least one of the test equipments include capacitors, and the capacitances of these capacitors in the at least one of the test equipments can be measured by other test equipments. The capacitances of these capacitors are used as a part of the calibration data. Explained in a different way, the deviations of the capacitances of these capacitors in the test equipments are further taken into consideration during the measurement of the under-test capacitance.

Figure 6:
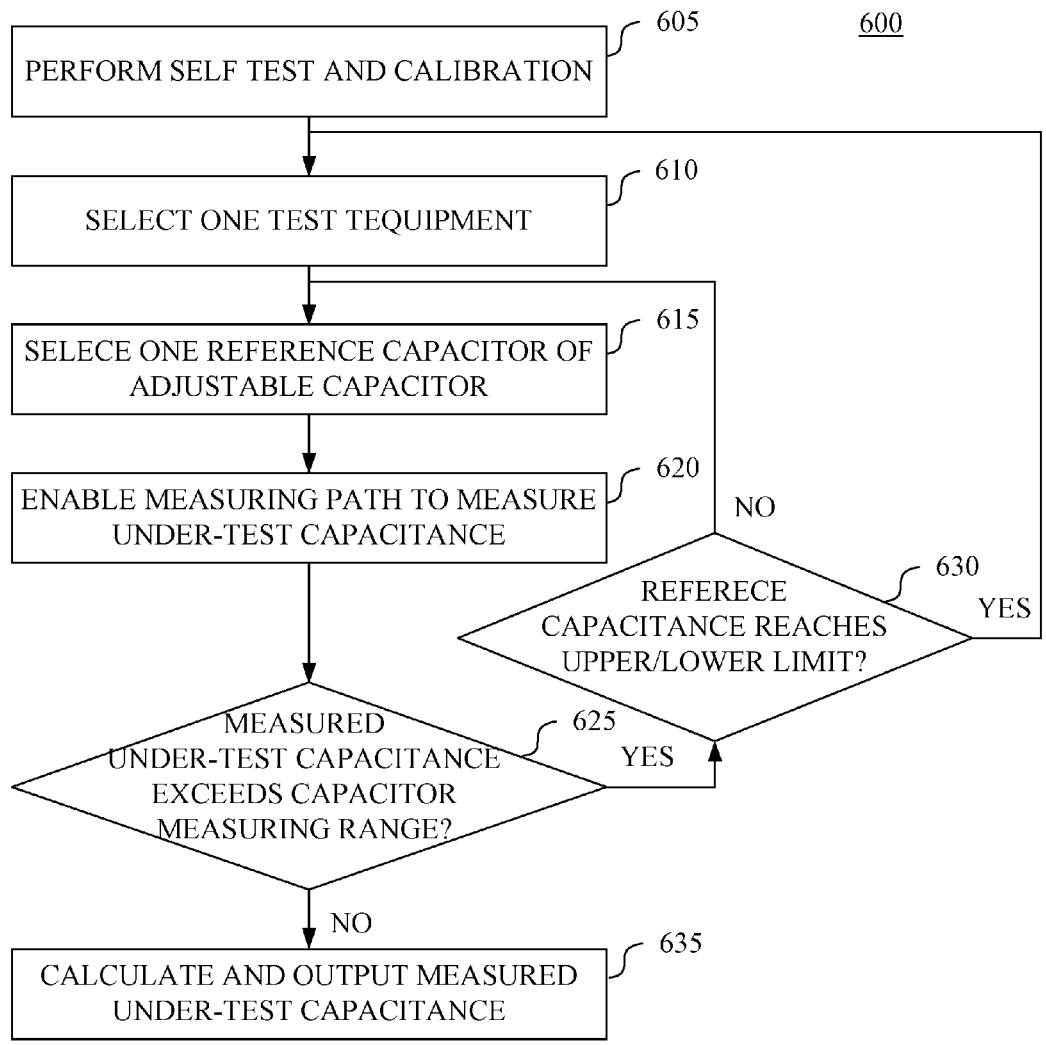
FIG. 6 is a flow chart of a capacitance-measuring method in accordance with various embodiments of the present disclosure.

FIG. 6 is a flow chart of a capacitance-measuring method 600 in accordance with various embodiments of the present disclosure. The capacitance-measuring method 600 is applied in the capacitance-measuring system 500 illustrated in FIG. 5C. For illustration, operations of the capacitance-measuring system 500 illustrated in FIG. 5C are described by the capacitance-measuring method 600.

In operation 605, the capacitance-measuring system 500 performs self test and calibration. For illustration, calibration paths are enabled to connect the adjustable capacitor module 570A or the adjustable capacitor module 570B to a test equipment to obtain the calibration data.

In operation 610, the control module 510 controls the switches 540 to select one of the test equipments to be conducted.

In operation 615, the control module 510 controls the adjustable capacitor module 570A or 570B to select one of the reference capacitors.

In operation 620, the control module 510 enables the measuring path including the under-test module 550 and one of the test equipments to measure the under-test capacitance of the under-test module 550. In some embodiments, the under-test module 550 is connected to the adjustable capacitor module 570A or 570B and further connected to the selected test equipment.

In operation 625, the control module 510 determines whether the measured under-test capacitance exceeds a capacitor measuring range of the selected test equipment.

When the measured under-test capacitance exceeds a capacitor measuring range of the selected test equipment, whether the reference capacitance of the selected capacitor reaches an upper or lower limit of the adjustable capacitor module 570A or 570B is determined, in operation 630. For illustration, in regard to the adjustable capacitor module 570A or 570B including a multiple of reference capacitors, whether the reference capacitor having the maximum or the minimum capacitance in the adjustable capacitor module 570A or 570B is selected is determined.

When the selected reference capacitance does not reach the upper or lower limit, the operation flow goes back to operation 615, and another one of the reference capacitors of the adjustable capacitor module 570A or 570B is selected.

Further, when the selected reference capacitance reaches the upper or lower limit, the operation flow goes back to operation 610 to select another one of the test equipments.

In operation 635, the control module 510 calculates and outputs the measured under-test capacitance when the measured under-test capacitance does not exceed the capacitor measuring range of the selected test equipment.

Figure 7:
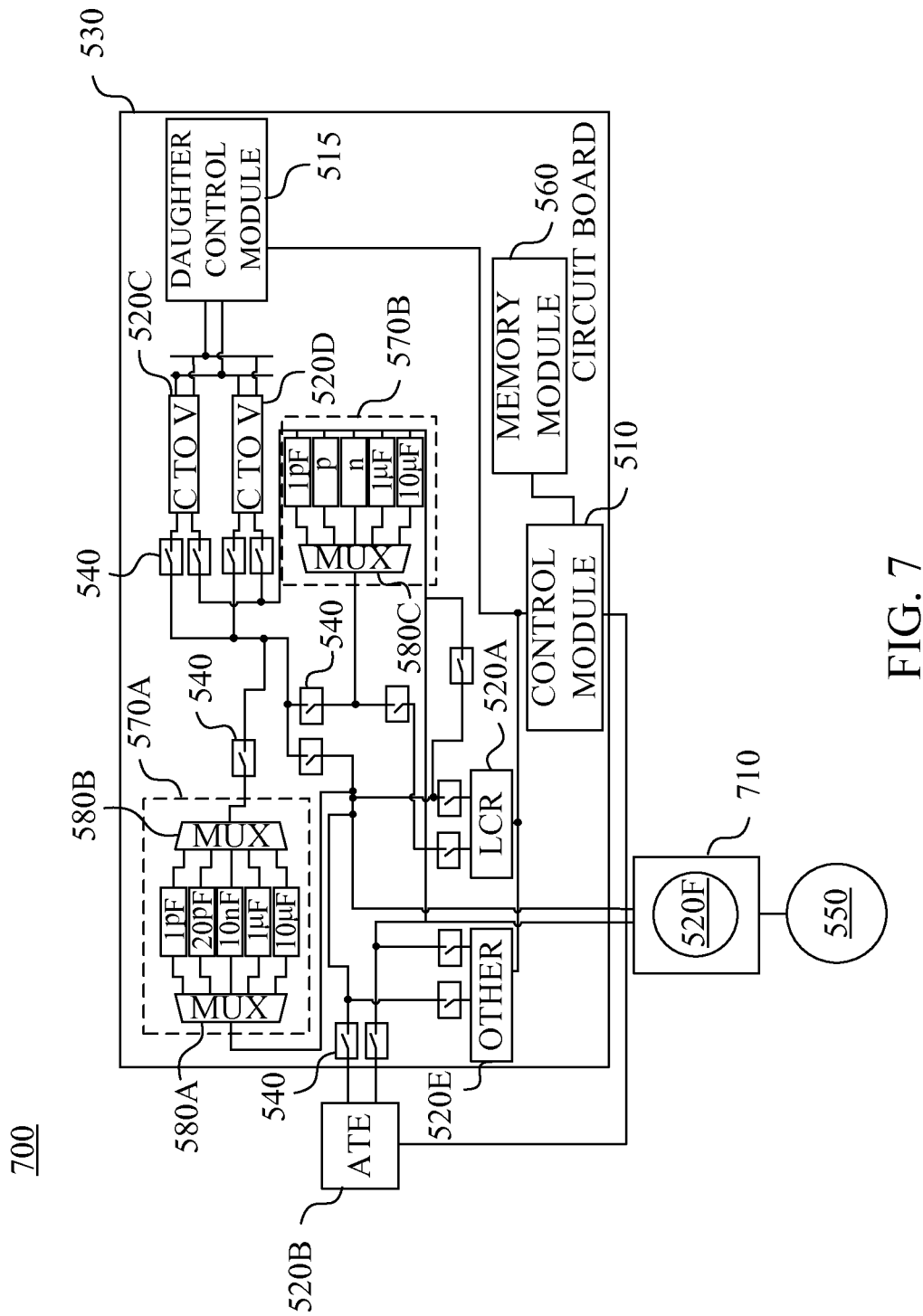
FIG. 7 is an exemplary diagram of a capacitance-measuring system in accordance with various embodiments of the present disclosure.

FIG. 7 is an exemplary diagram of a capacitance-measuring system 700 in accordance with various embodiments of the present disclosure.

Compared with the capacitance-measuring system 500 illustrated in FIGS. 5A-5C, the measuring module 520F in the capacitance-measuring system 700 is disposed on a circuit board 710, and the circuit board 710 is different from the circuit board 530.

As illustrated in FIG. 7, the measuring module 520F not only measures the under-test capacitances of the under-test module 550, but also serves as an interface for other test equipments to perform measurement on the under-test module 550. The control module 510 controls the switches 540 to enable a measuring path that connects the under-test module 550 to one of the test equipments through the measuring module 520F.

In some embodiments, the under-test module 550 is a wafer or a metal-insulator-metal layer such that parts of the test equipments are not capable of measuring the under-test module 550 directly. Under such a condition, the under-test module 550 is measured by such test equipments through the measuring module 520F.

In some embodiments, the measuring module 520F illustrated in FIG. 7 is integrated into the circuit board 530 to avoid the need of the additional circuit board 710. Other test equipments still measure the under-test module 550 through the measuring module 520F under a proper design of wirings therebetween.

Based on the selection of different reference capacitances of the adjustable capacitor module 570A or 570B, the measuring range of the test equipment is extended. Further, based on the selection of different test equipments, the capacitance-measuring system 500 measures a wide range of capacitances of the under-test capacitors of the under-test module 530.

In some embodiments, a circuit is disclosed that includes a stacked circuit layer, a plurality of test contact points and a comparator. The stacked circuit layer includes a plurality of reference capacitors, each of the plurality of reference capacitors having a reference capacitance. Each of the test contact points is configured to be electrically connected to an under-test capacitor of an under-test module. The comparator compares the reference capacitance of one of the reference capacitors with an under-test capacitance of the under-test capacitor corresponding to one of the test contact points to measure a range of the under-test capacitance.

Also disclosed is a circuit that includes a plurality of test equipments and a control module. The test equipments have different capacitance-measuring ranges. One of the test equipments includes a measuring module. The measuring module includes a stacked circuit layer, a plurality of test contact points and a comparator. The stacked circuit layer includes a plurality of first reference capacitors, each of the plurality of reference capacitors having a first reference capacitance. Each of the test contact points is configured to be electrically connected to an under-test capacitor of an under-test module. The comparator compares the first reference capacitance of one of the first reference capacitors and an under-test capacitance of the under-test capacitor corresponding to one of the test contact points to measure a range of the under-test capacitance. The control module is configured to enable a measuring path including the under-test module and a selected one of the test equipments to measure the under-test capacitance of the under-test capacitor of the under-test module.

Also disclosed is a method that includes the operations outlined below. A measuring path including an under-test module and a selected one of a plurality of test equipments is enabled to measure an under-test capacitance of an under-test capacitor of an under-test module. Whether the measured under-test capacitance exceeds a capacitor measuring range of the selected one of the test equipments is determined. The selected one of the test equipments is replaced by selecting another one of the test equipments to measure the under-test capacitance when the measured under-test capacitance exceeds the capacitor measuring range of the selected one of the test equipments. The measured under-test capacitance is outputted when the measured under-test capacitance falls in the capacitor measuring range of the selected one of the test equipments.

In this document, the term "connected" may be termed as "electrically connected", and the term "coupled" may be termed as "electrically coupled". "Connected" and "coupled" may also be used to indicate that two or more elements cooperate or interact with each other.

The number and configuration of the stacked circuit layer, the reference capacitors and the under-test capacitors therein in this document are for illustrative purposes. Various numbers and configurations of the stacked circuit layer, the reference capacitors and the under-test capacitors therein are within the contemplated scope of the present disclosure.

The number and configuration of the test equipments, switches and the adjustable capacitor modules therein in this document are for illustrative purposes. Various numbers and configurations of the test equipments, switches and the adjustable capacitor modules therein are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit comprising:
   a stacked circuit layer comprising a plurality of reference capacitors, each of the plurality of reference capacitors having a reference capacitance;
   a plurality of test contact points configured to be electrically coupled to a plurality of under-test capacitors of an under-test module, respectively, wherein the test contact points are independent and different from one another, wherein the under-test capacitors are independent and different from the reference capacitors, wherein the under-test module is one of a first wafer, a first metal-insulator-metal layer, and a first integrated circuit package that comprises a plurality of first metal-insulator-metal capacitors; and
   a comparator configured to compare the reference capacitance of a selected reference capacitor of the reference capacitors with an under-test capacitance of one of the under-test capacitors corresponding to a selected test contact point of the test contact points, to measure a range of the under-test capacitance.

2. The circuit of claim 1, further comprising:
   a first multiplexer configured to select one of the reference capacitors; and
   a second multiplexer configured to select one of the test contact points,
   wherein the comparator is configured to compare the reference capacitance of the selected reference capacitor, with the under-test capacitance corresponding to the selected test contact point.

3. The circuit of claim 2, wherein the first multiplexer, the second multiplexer, and the comparator are formed in the stacked circuit layer.

4. The circuit of claim 2, wherein the stacked circuit layer is disposed on a circuit board, and the first multiplexer, the second multiplexer, and the comparator are formed on the circuit board.

5. The circuit of claim 1, wherein the stacked circuit layer is a second wafer, a second metal-insulator-metal layer or a second integrated circuit package that comprises a plurality of second metal-insulator-metal capacitors.

6. A circuit comprising:
   a plurality of test equipments having different capacitance-measuring ranges, one of the test equipments comprising a measuring module, the measuring module comprising:
   a stacked circuit layer comprising a plurality of first reference capacitors, each of the plurality of first reference capacitors having a first reference capacitance;
   a plurality of test contact points configured to be electrically coupled to a plurality of under-test capacitors of an under-test module, respectively, wherein the test contact points are independent and different from one another, wherein the under-test capacitors are independent and different from the first reference capacitors, wherein the under-test module is one of a wafer, a metal-insulator-metal layer, and an integrated circuit package that comprises a plurality of metal-insulator-metal capacitors; and
   a comparator configured to compare the first reference capacitance of a selected reference capacitor of the first reference capacitors with an under-test capacitance of one of the under-test capacitors corresponding to a selected contact point of the test contact points, to measure a range of the under-test capacitance; and
   a control module configured to enable a measuring path comprising the under-test module and a selected one of the test equipments to measure the under-test capacitance of the under-test capacitor of the under-test module.

7. The circuit of claim 6, wherein the control module is configured to replace the selected one of the test equipments in the measuring path by selecting another one of the test equipments to measure the under-test capacitance when the measured under-test capacitance exceeds a capacitor measuring range of the selected one of the test equipments, and the control module is configured to output the measured under-test capacitance when the measured under-test capacitance falls in the capacitor measuring range of the selected one of the test equipments.

8. The circuit of claim 6, further comprising a plurality of switches, wherein the control module is configured to enable the measuring path by controlling the switches to couple the under-test module and one of the test equipments.

9. The circuit of claim 6, further comprising an adjustable capacitor module having an adjustable reference capacitance, wherein the control module is configured to enable the measuring path comprising the under-test module, the adjustable capacitor module and the selected one of the test equipments, and the under-test module and the adjustable capacitor module are coupled either in parallel or in series.

10. The circuit of claim 9, wherein the control module is configured to control the adjustable capacitor module to adjust the adjustable reference capacitance when the measured under-test capacitance exceeds a capacitor measuring range of the selected one of the test equipments in the measuring path, and the control module is configured to output the measured under-test capacitance when the measured under-test capacitance falls in the capacitor measuring range of the selected one of the test equipments.

11. The circuit of claim 10, wherein the control module obtains the measured under-test capacitance according to a total measured capacitance of the under-test module and the adjustable capacitor module and the adjustable reference capacitance of the adjustable capacitor module.

12. The circuit of claim 9, wherein the adjustable capacitor module either comprises a variable capacitor or comprises a plurality of second reference capacitors each having a second reference capacitance and at least one multiplexer for selecting one of the second reference capacitors.

13. The circuit of claim 10, wherein the control module further enables a calibration path comprising the adjustable capacitor module and one of the test equipments to measure the adjustable reference capacitance of the adjustable capacitor module to obtain calibration data, and the control module further obtains the measured under-test capacitance according to a total measured capacitance of the under-test module and the adjustable capacitor module, the capacitance of the adjustable capacitor module and the calibration data.

14. The circuit of claim 6, wherein the control module is configured to enable the measuring path to couple the under-test module to the selected one of the test equipments through the measuring module.

15. A method comprising:
enabling a measuring path comprising an under-test module and a selected one of a plurality of test equipments;
selecting one of a plurality of test contact points that are electrically coupled to a plurality of under-test capacitors of the under-test module, respectively, to measure an under-test capacitance of one of the under-test capacitors, wherein the test contact points are independent and different from one another, wherein the under-test module is one of a wafer, a metal-insulator-metal layer, and an integrated circuit package that comprises a plurality of metal-insulator-metal capacitors;
determining whether the measured under-test capacitance exceeds a capacitor measuring range of the selected one of the test equipments;
replacing the selected one of the test equipments by selecting another one of the test equipments to measure the under-test capacitance when the measured under-test capacitance exceeds the capacitor measuring range of the selected one of the test equipments; and
outputting the measured under-test capacitance when the measured under-test capacitance falls in the capacitor measuring range of the selected one of the test equipments.

16. The method of claim 15, further comprising enabling the measuring path comprising the under-test module, an adjustable capacitor module having an adjustable reference capacitance and the selected one of the test equipments, wherein the under-test module and the adjustable capacitor module are coupled either in parallel or in series.

17. The method of claim 16, further comprising controlling the adjustable capacitor module to adjust the adjustable reference capacitance to measure the under-test capacitance when the measured under-test capacitance exceeds the capacitor measuring range of the selected one of the test equipments.

18. The method of claim 16, further comprising calculating the measured under-test capacitance according to a total measured capacitance of the under-test module and the adjustable capacitor module and the adjustable reference capacitance of the adjustable capacitor module.

19. The method of claim 16, further comprising:
enabling a calibration path comprising the adjustable capacitor module and one of the test equipments to measure the adjustable reference capacitance of the adjustable capacitor module to obtain calibration data; and
calculating the measured under-test capacitance according to a total measured capacitance of the under-test module and the adjustable capacitor module, the capacitance of the adjustable capacitor module and the calibration data.

20. The method of claim 15, wherein when a measuring module of the test equipments is selected to be comprised in the measuring path, the method further comprises:
selecting one of a plurality of reference capacitors having a reference capacitance in a stacked circuit layer of the measuring module;
comparing the reference capacitance with the under-test capacitance to measure a range of the under-test capacitance.

* * * * *